US007735484B2

(12) United States Patent
Shin et al.

(10) Patent No.: US 7,735,484 B2
(45) Date of Patent: *Jun. 15, 2010

(54) LIGHT-COLLECTING BASE-BODY STRUCTURE

(75) Inventors: Hwa-Yuh Shin, Lungtan (TW); Hung-Sheng Chiu, Lungtan (TW); Chieh Cheng, Lungtan (TW); Hwen-Fen Hong, Lungtan (TW); Cherng-Tsong Kuo, Lungtan (TW)

(73) Assignee: Atomic Energy Council, Taoyuan (TW)

( * ) Notice: Subject to any disclaimer, the term of this patent is extended or adjusted under 35 U.S.C. 154(b) by 119 days.

This patent is subject to a terminal disclaimer.

(21) Appl. No.: 11/808,131

(22) Filed: Jun. 6, 2007

(65) Prior Publication Data
US 2008/0302356 A1    Dec. 11, 2008

(51) Int. Cl.
*B65D 7/30* (2006.01)

(52) U.S. Cl. .............. 126/704; 362/153; 136/248; 136/291; 49/501

(58) Field of Classification Search .......... 126/704; 362/153; 136/248, 291; 49/501
See application file for complete search history.

(56) References Cited

U.S. PATENT DOCUMENTS

| 3,784,043 | A | * | 1/1974 | Presnick | 220/4.28 |
| 4,205,486 | A | * | 6/1980 | Guarnacci | 49/501 |
| 5,221,363 | A | * | 6/1993 | Gillard | 136/248 |
| 5,623,783 | A | * | 4/1997 | Kenkel | 49/21 |
| 6,067,760 | A | * | 5/2000 | Nowell | 52/204.57 |
| 6,123,400 | A | * | 9/2000 | Nicolai et al. | 312/265.1 |
| 2004/0111974 | A1 | * | 6/2004 | Boroviak | 49/501 |

* cited by examiner

*Primary Examiner*—Steven B McAllister
*Assistant Examiner*—Nikhil Mashruwala
(74) *Attorney, Agent, or Firm*—Jackson IPG PLLC (57) ABSTRACT

A base body comprises two frames to put lens and solar cells. The working process is simple and the weight and the cost of the base body is reduced.

10 Claims, 9 Drawing Sheets

LIGHT-COLLECTING BASE-BODY STRUCTURE

FIELD OF THE INVENTION

The present invention relates to a base-body structure; more particularly, relates to fast assembling a base body with simple process and reduced weight and cost.

DESCRIPTION OF THE RELATED ART

Figure 5:
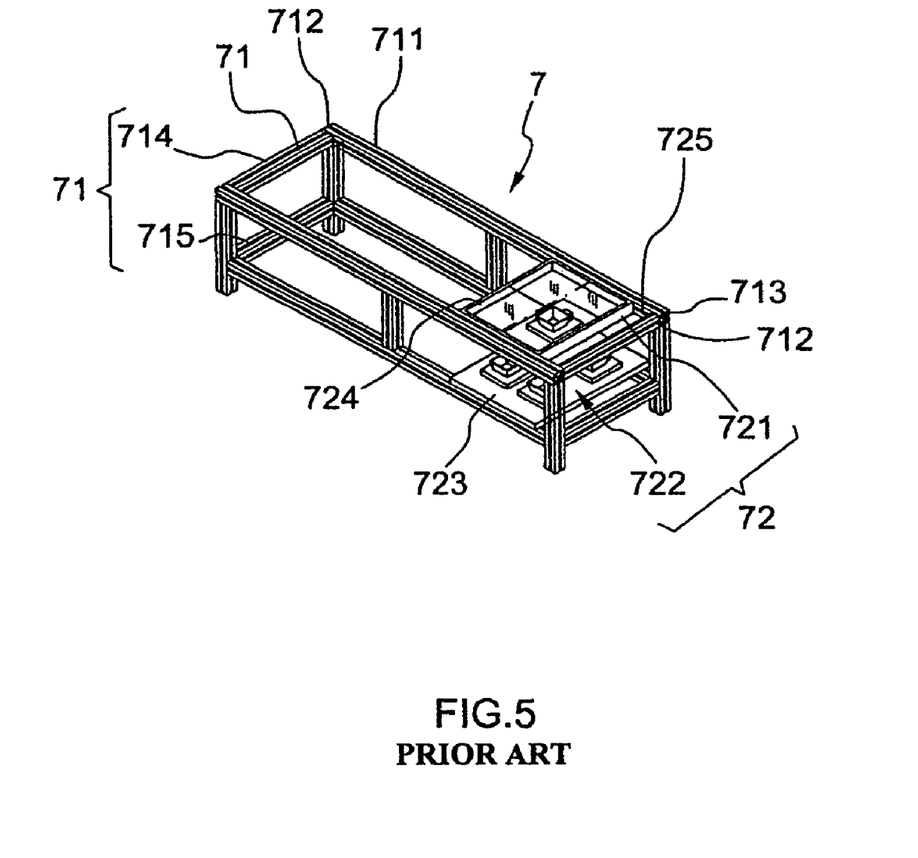
FIG. 5 is the explosive view of the prior art.
Figure 6:
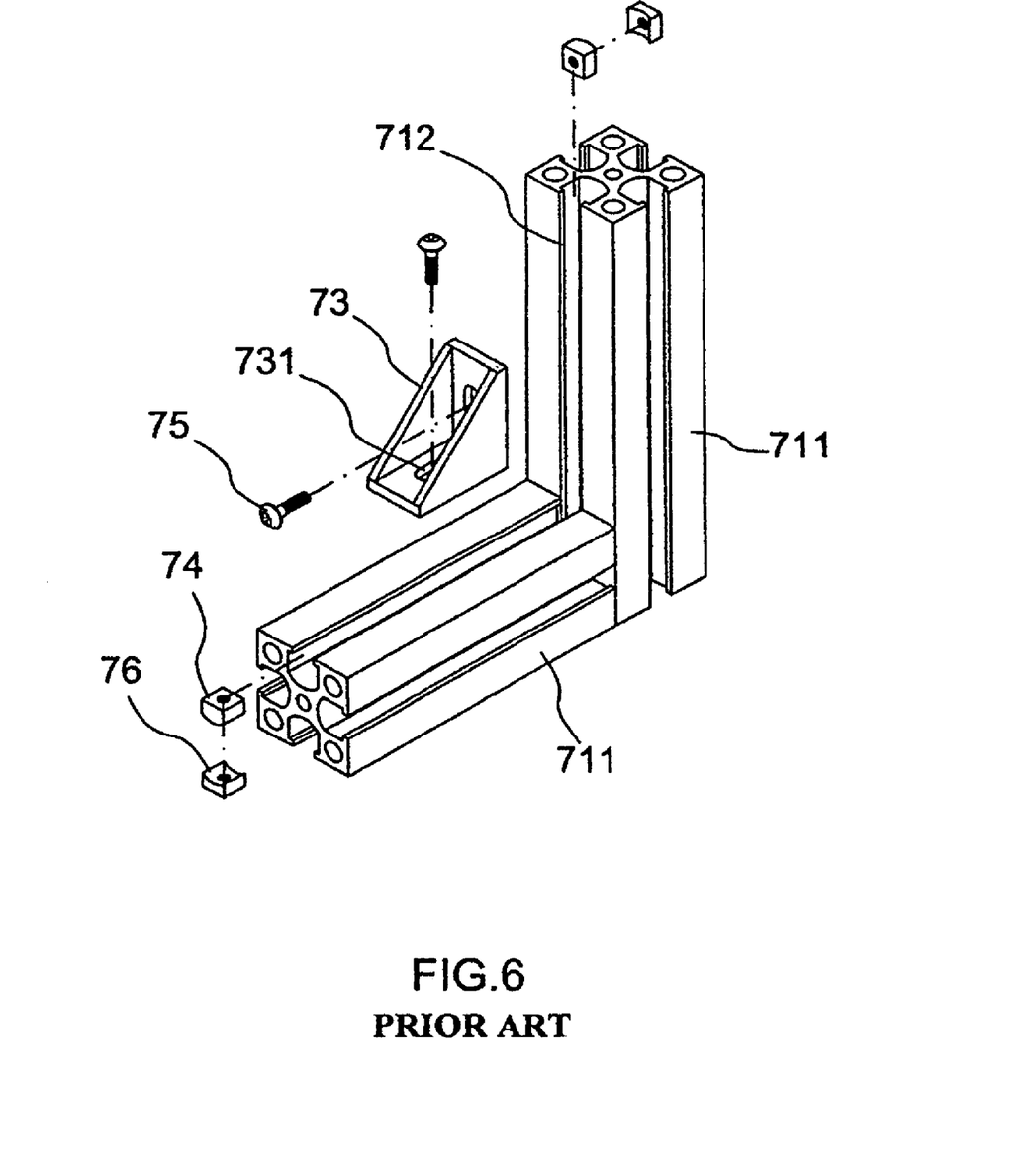
FIG. 6 and FIG. 7 are the views of assembling the carrying frame of the prior art.
Figure 7:
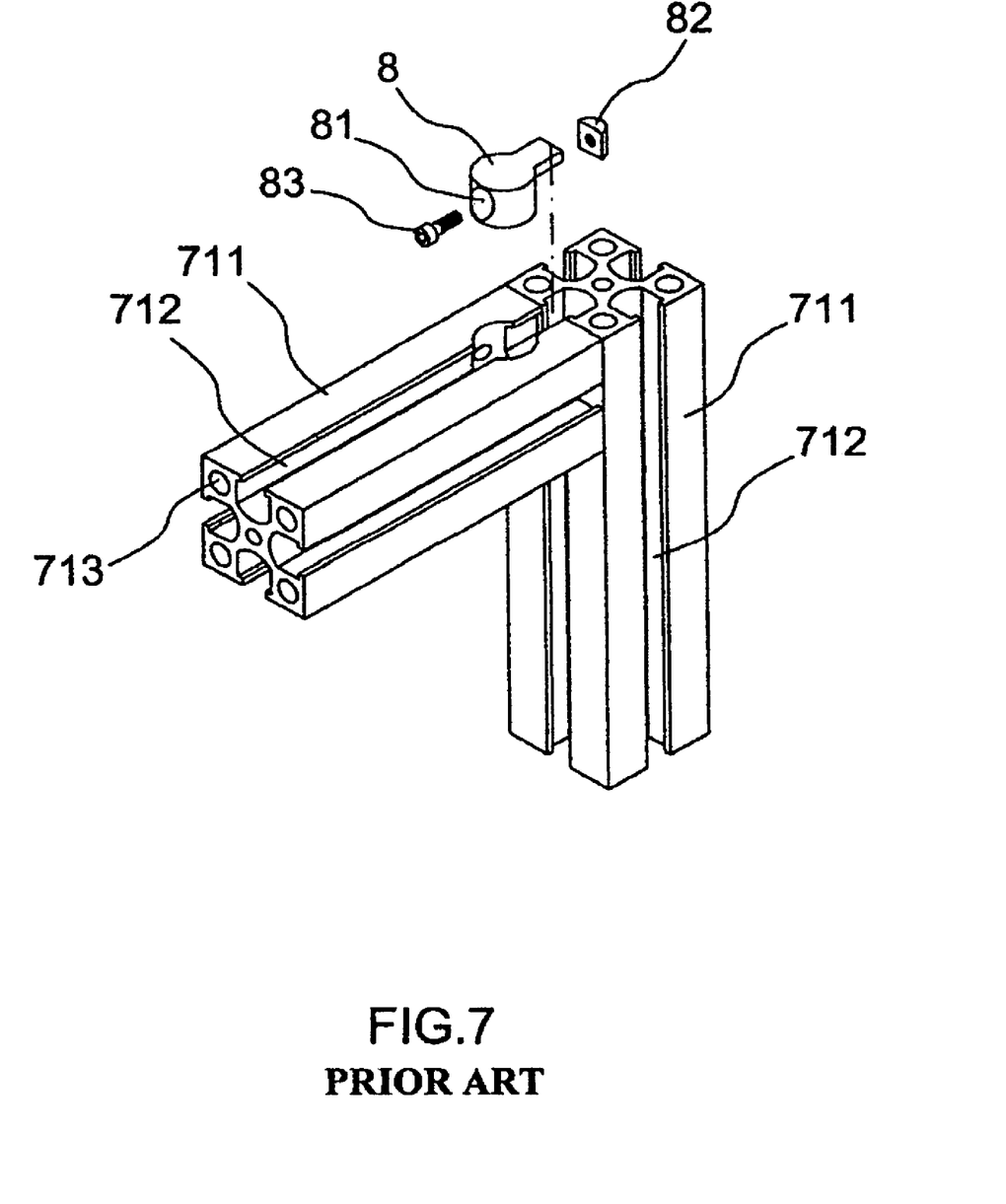

A concentration-type solar power generation apparatus 7, as shown in FIG. 5, comprises a carrying frame 71 and at lease one light-collecting unit 72 deposed on the carrying frame 71. The carrying frame 71 comprises a plurality of rod components 711; at least one sliding trough 712 is located on a side surface of the rod component 711; and, the rod component 711 comprises at least one hollow portion 713 to reduce weight. The light-collecting unit 72 comprises a Fresnel lens 721 and a solar cell module 722; the solar cell module 722 is deposed on the carrying frame 71 with a plate component 723; the Fresnel lens 721 is deposed on the carrying frame 71 with a frame set 724; the frame set 724 has a side wing 725 to insert in the sliding trough 712 of the corresponding rod component 71; and, the carrying frame 71 has an upper frame 714 to carry the Fresnel lens 721 and a lower frame 715 to carry the solar cell module 722. As further shown in FIG. 6, the carrying frame 71 is assembled with an angle component 73, a female screw 74 and a screw plug 75, where the angle component 73 has a plurality of borings 731 and is adhered to two vertically connected rod components 711; the female screw 74 is set in the sliding trough 712 of the rod component 711; the screw plug 75 is fixed to the female screw 74 through the boring 731 of the angle component 73; the female screw 74 is fixed to the sliding trough 712 coordinated with a washer component 76. Or, as further shown in FIG. 7, the carrying frame 71 is assembled with a fixing hole 8, a female screw 82 and a screw plug 83, where the fixing hole 8 is set in the sliding trough 712 of the rod component 711; the female screw is set in the sliding trough 712 of the vertically adjacent rod component 711; and the screw plug 83 is fixed to the female screw 82 through the boring 81 of the fixing hole 8. Thus, a concentration-type solar power generation apparatus 7 is formed.

Although the concentration-type solar power generation apparatus 7 is formed with the above components, its carrying frame 71 uses an angle component 73, a female screw 74, a screw plug 75 and a washer component 76, or a fixing hole 8, a female screw 82 and a screw plug 83, to fix the rod components 711 for assembling a carrying frame 71 so that the working process for assembling the carrying frame 71 becomes complex; the cost is increased and the assembling efficiency is reduced; and the carrying frame 71 obtained is heavier with these fixing components. Hence, the prior art does not fulfill users' requests on actual use.

SUMMARY OF THE INVENTION

The main purpose is to form a first frame and a second frame by using a plurality of rod bodies coordinated with a plurality of connection units to obtain a base-body structure fixed with a plurality of supporting units, where the working process is simplified and weight and cost are reduced.

To achieve the above purpose, the present invention is a light-collecting base-body structure, comprising a plurality of first rod bodies, a plurality of second rod bodies, a plurality of connection units and a plurality of supporting units, where the first rod body has a ladder-like gap portion at a side edge a plurality of long troughs are located on a side surface and an adjacent side surface of the first and the second rod bodies; each of the first and the second rod bodies has a hollow portion penetrated through the middle; the plurality of connection units are set in the hollow portions of the first and the second rod bodies to connect the first and the second rod bodies to form a first frame and a second frame; the supporting unit comprises two side plates; the side plate is fixed to the first frame and the second frame in between with fixing members to be fixed in the long troughs of the first and the second rod bodies to fix the supporting unit at a place two adjacent first rod bodies or second rod bodies are connected. Accordingly, a novel light-collecting base-body structure is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
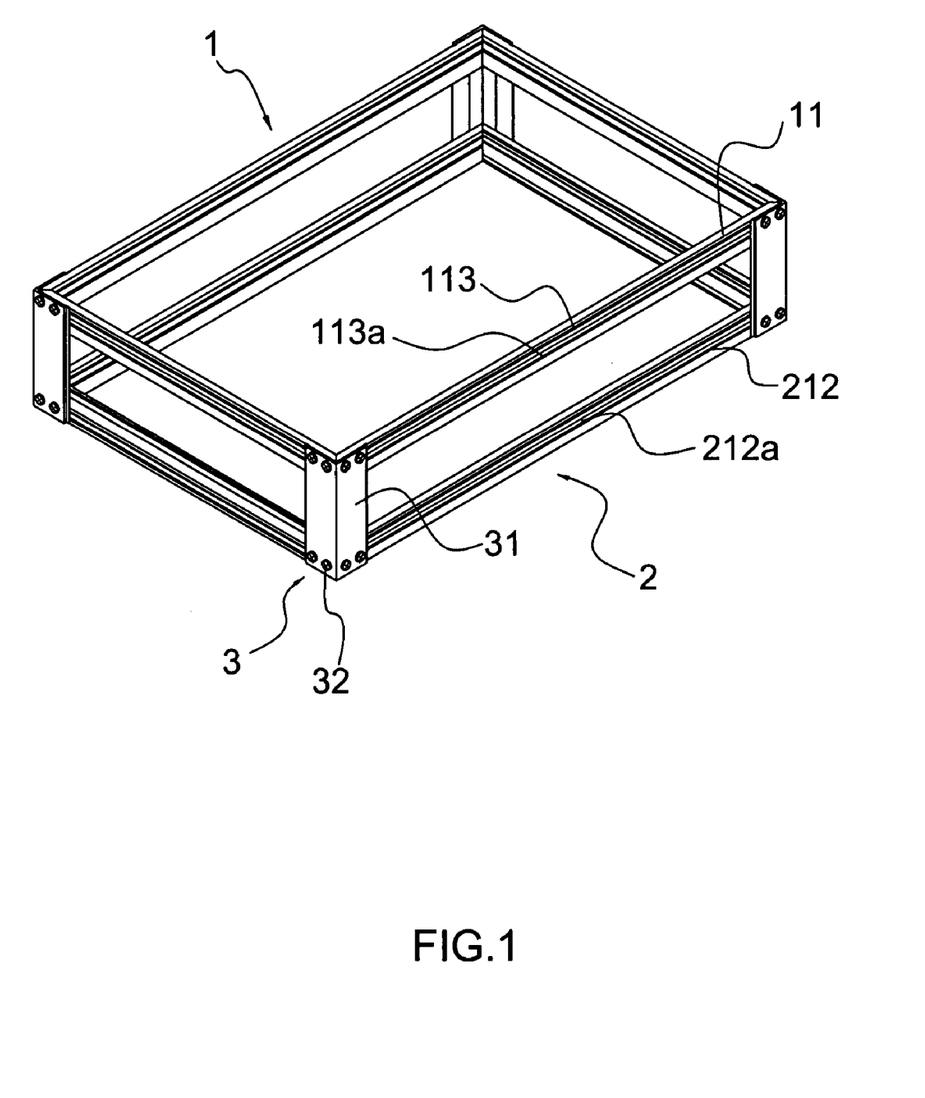
FIG. 1 is the perspective view showing the preferred embodiment according to the present invention.
Figure 2A:
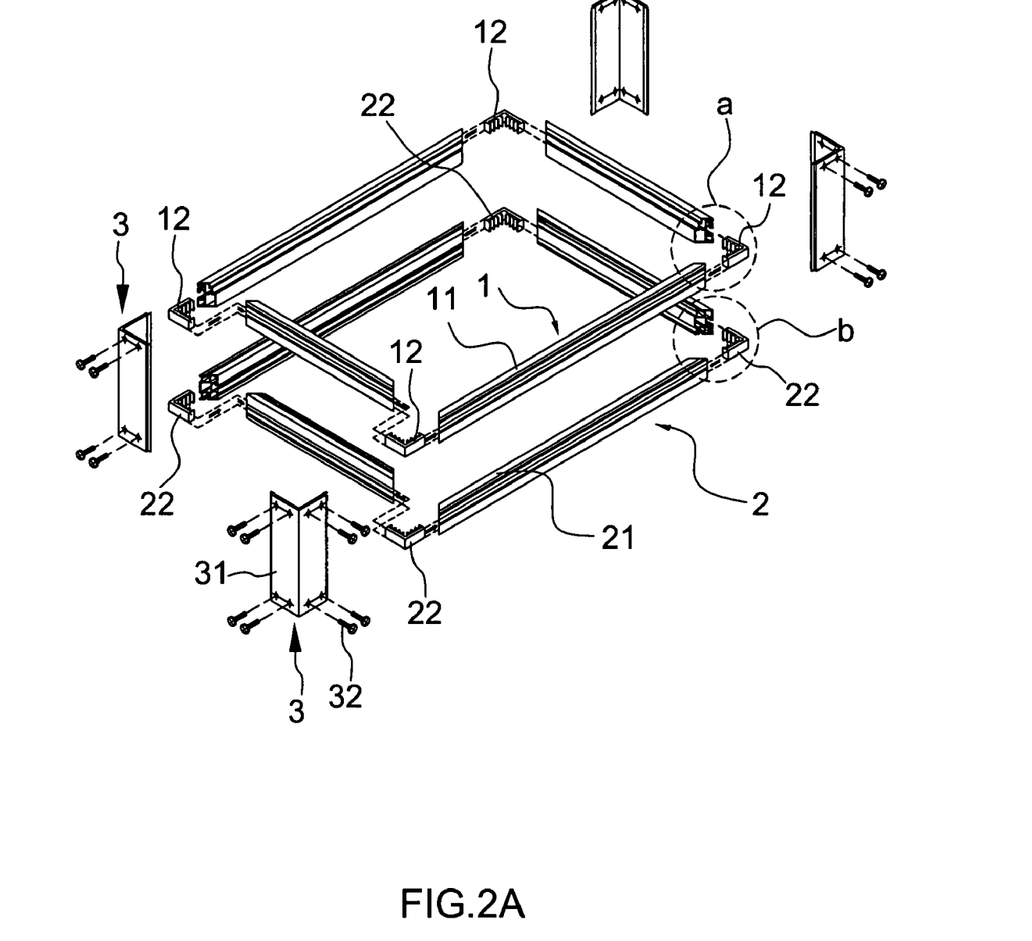
FIG. 2A is the explosive view showing the preferred embodiment.
Figure 2B:
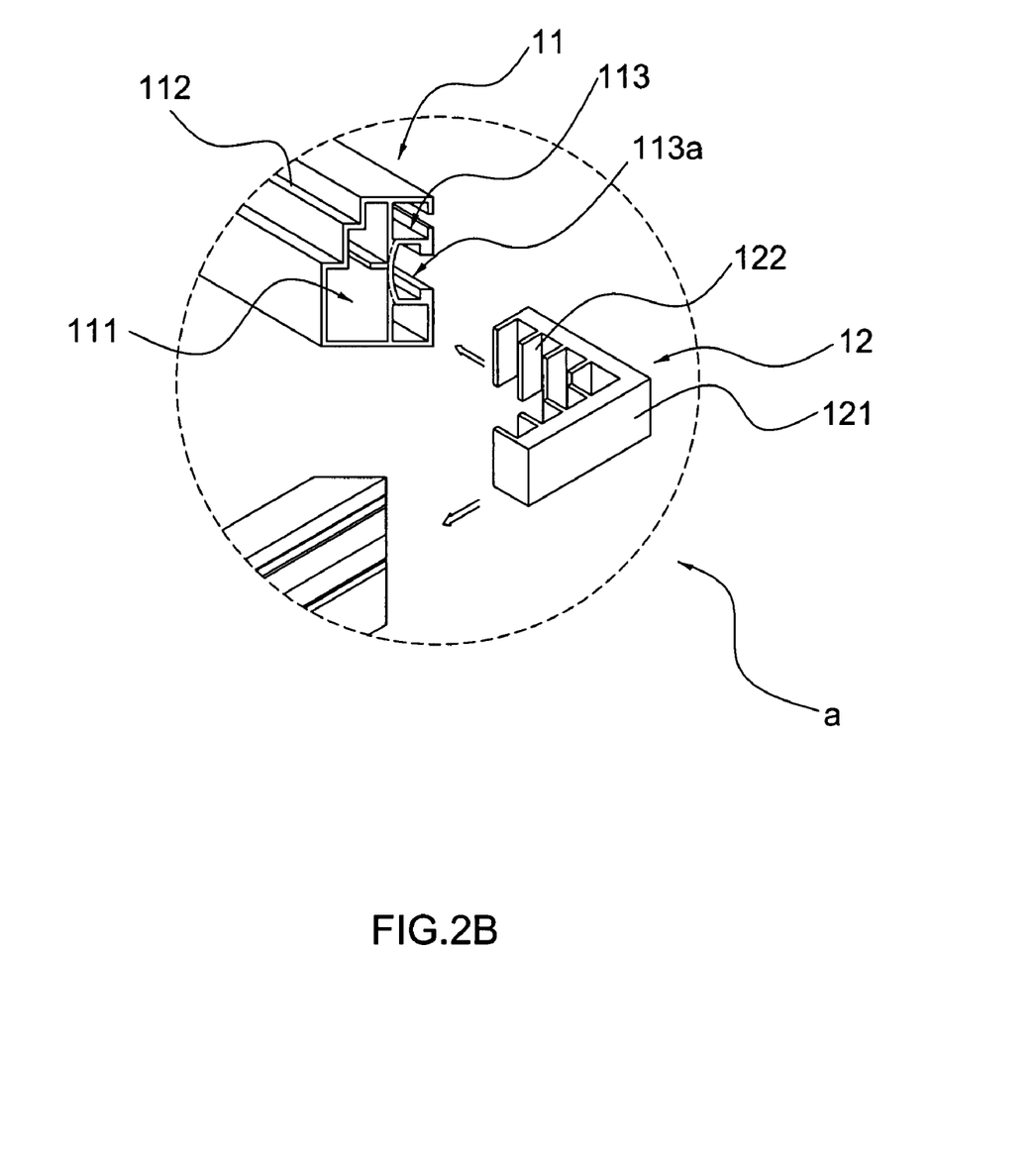
FIG. 2B is the enlarged view of a in FIG. 2A.
Figure 2C:
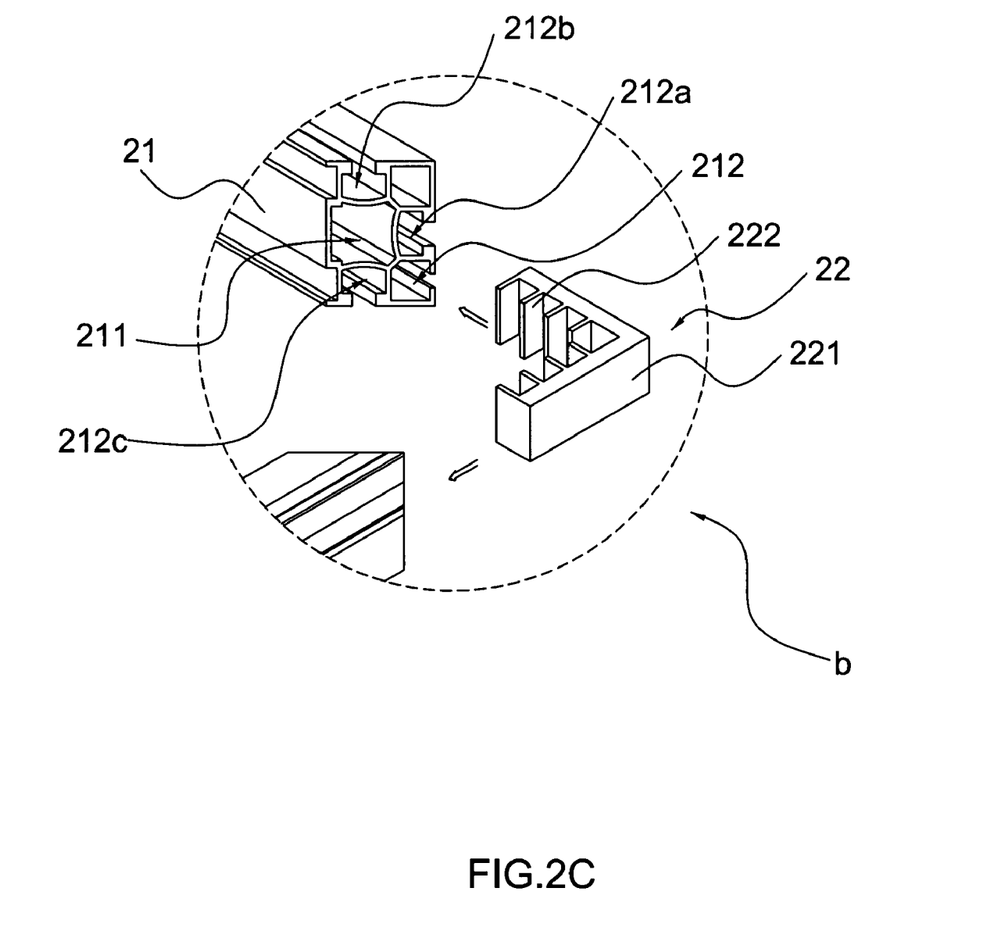
FIG. 2C is the enlarged view of b in FIG. 2A.

Please refer to FIG. 1 to FIG. 2C, which are a perspective view showing the preferred embodiment according to the present invention; an explosive view showing the preferred embodiment and enlargement views of a and b in FIG. 2A. As shown in the figures, the present invention is light-collecting base-body structure, comprising a first frame 1, a second frame 2 and a plurality of supporting units 3, where the working process is simplified for fast assembling and cost and weight are reduced.

The first frame 1 comprises a plurality of first rod bodies 11, each having a hollow portion 111; and a plurality of connection units 12 in the hollow portions 111 of two adjacent first rod bodies 11, where the connection unit 12 has an 'L' shape and comprises two insertion portions 121 which are connected at a side and are inserted into the hollow portions 111 of the first rod bodies 11 separately; each of the two adjacent surfaces of the two insertion portions 121 of the connection unit 12 has a plurality of interference portions 122; a ladder-like gap portion 112 is located at a side edge of the first rod body 11; and a plurality of long troughs 113, 113$a$ is located on a side surface and at least one adjacent side surface of the first rod body 11.

The second frame 2 comprises a plurality of second rod bodies 21, each having a hollow portion 211; and a plurality of connection units 22 in the hollow portions 211 of two adjacent second rod bodies 21, where the connection unit 22 has an 'L' shape and comprises two insertion portions 221 which are connected at a side and a reinserted in to the hollow portions 211 of the second rod bodies 21 separately; each of the two adjacent surfaces of the two insertion portions 221 of the connection unit 22 has a plurality of interference portions 222; and a plurality of long troughs 212, 212a, 212b, 212c is located on a side surface and at least one adjacent side surface of the second rod body 21.

The supporting unit 3 comprises two side plates 31 connected at a side. The side plate 31 is fixed to the first and the second frames 1, 2 at two ends coordinated with the fixing members 32 to be fixed to the long troughs 113a, 212a of the first and the second rod bodies 11, 21 so that the side plate 31 is fixed at a place the two first rod bodies 11 or the two second rod bodies 21 are connected. Thus, a novel solar energy base-body structure is obtained.

Figure 3:
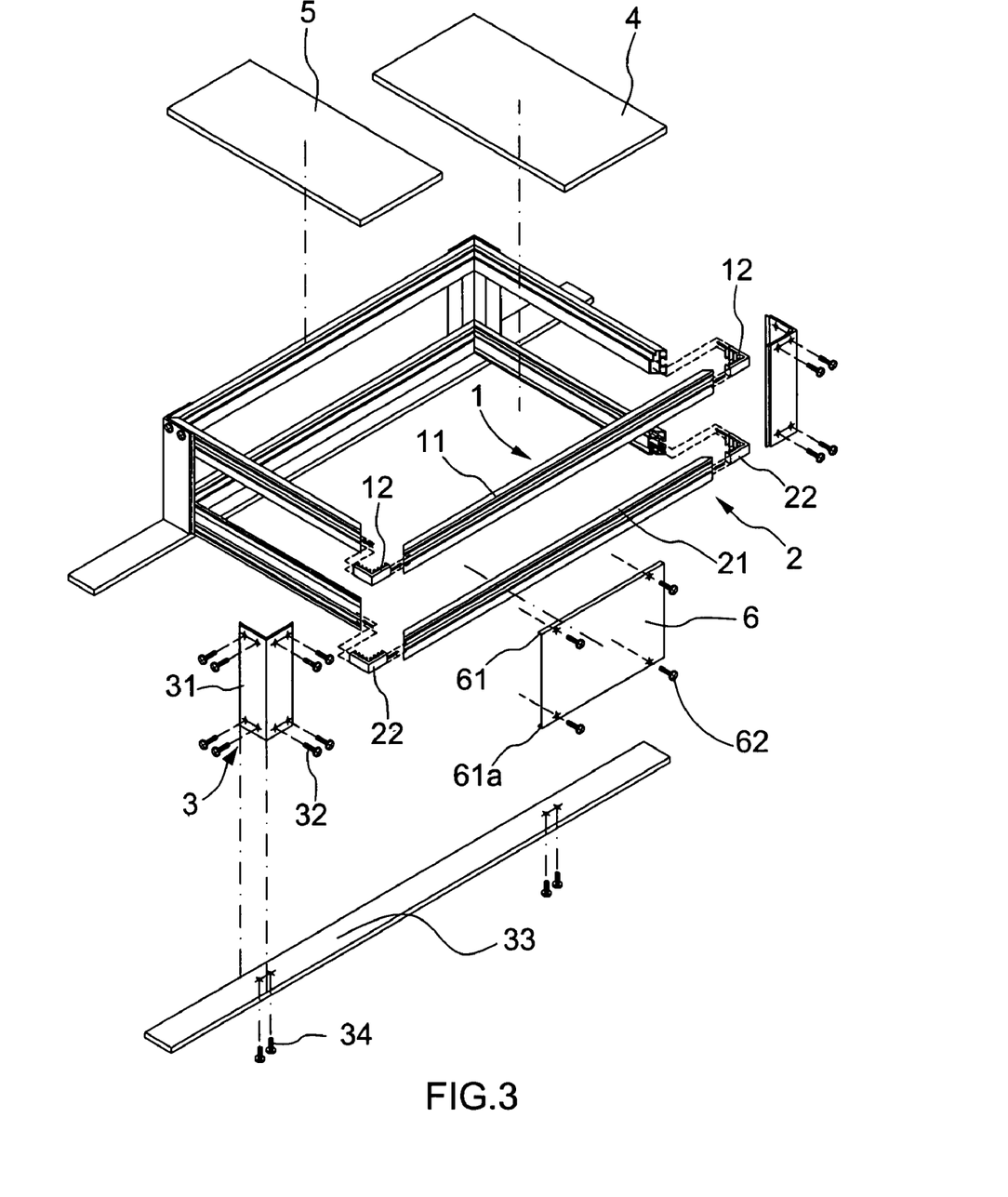
FIG. 3 is the view showing the assembling of the state of use.
Figure 4:
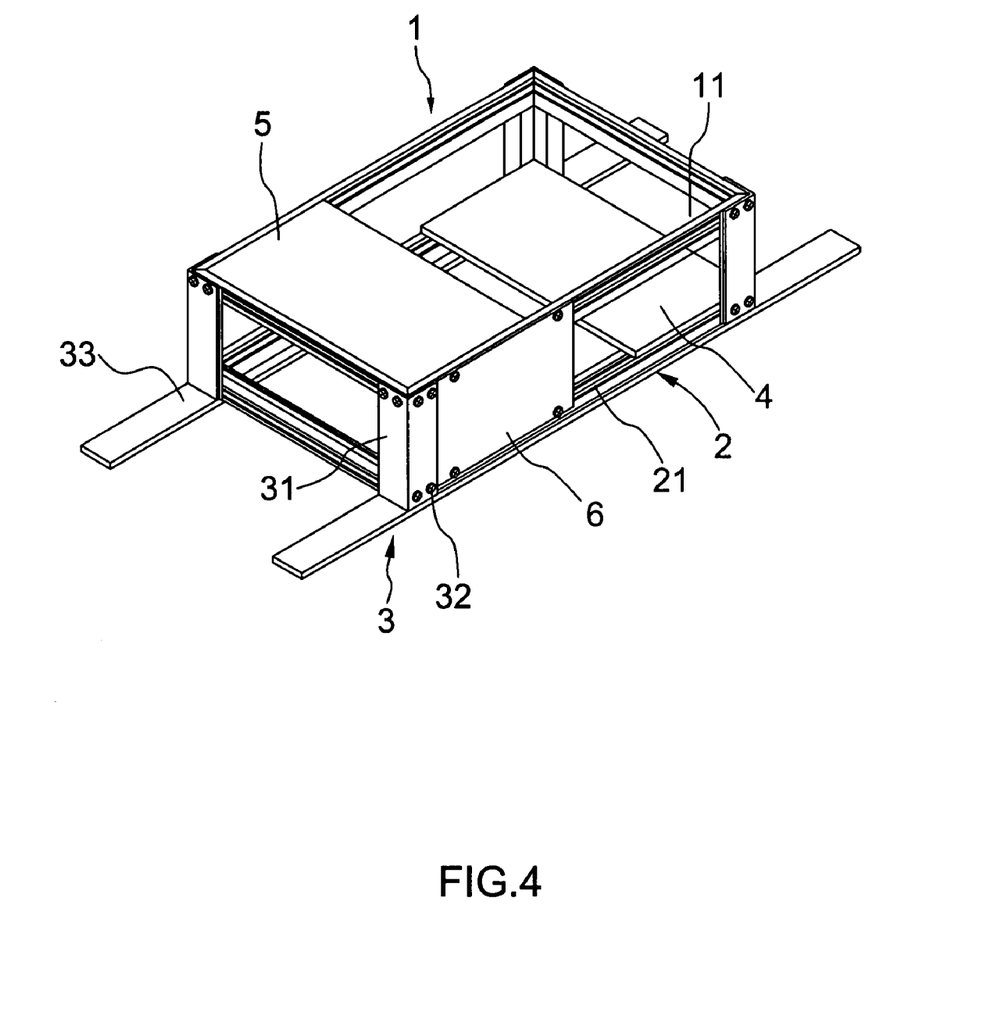
FIG. 4 is the view showing the state of use.

Please refer to FIG. 3 and FIG. 4, which are a view showing an assembling of a state of use; and a view showing the state of use. As shown in the figure, when assembling the present invention, at least four first rod bodies 11 and at least four connection units 12 are obtained. Insertion portions 122 of the connection units 12 are inserted into hollow portions 111 of the first rod bodies 11 from two ends, where the two insertion portions 121 are interfered with inner walls of the hollow portions 111 by the insertion portions 121 to be firmly inserted into the first rod bodies 11. Thus, a first frame 1 is formed.

Then at least four second rod bodies 21 and at least four connection units 22 are obtained. Insertion portions 222 of the connection units 22 are inserted into hollow portions 211 of the second rod bodies 21 from two ends, where the two insertion portions 221 are interfered with inner walls of the hollow portions 111 by the insertion portions 221 to be firmly inserted into the second rod bodies 21. Thus, a second frame 2 is formed.

After the first and the second frames 1, 2 are formed, four supporting units 3 are obtained to be fixed at the four corners of the first and the second frames 1, 2. Each supporting unit 3 has two side plates 31. Two ends of each side plate 31 are fixed to the long troughs 113a, 212a of the first and the second rod bodies 11, 12 coordinated with fixing members 32 so that the supporting units 3 are fixed between the first and the second frames 1, 2 and are positioned at the places two adjacent first rod bodies 11 and two adjacent second rod bodies 21 are connected. A solar cell seat 4 is fixed to the long troughs 212b of the second rod bodies 21 of the second frame 2. A lens 5 is set across on corresponding gap portions 112 located at inner side edges of the first rod bodies 11 of the first frame 1. A cap plate 6 is fixed across the first and the second frames 1, 2. The cap plate 6 is slightly bent at the edge to obtain an 'n' shape to set the extension portions 61, 61a of the cap plate 6 in the long troughs 113, 212 of the first and the second rod bodies 11, 21. And the cap plate 6 is fixed to another long troughs 113a, 212a of the first and the second rod bodies 11, 21 coordinated with fixing members 62. Thus, the cap plate 6 is fixed on side surface between the first and the second frames 1, 2. At last, a supporting plate 33 is fixed at bottom of at least one second rod body 21. Two ends of the supporting plate 33 are directly fixed to long troughs 212c of the second rod body 21 with fixing members 34 to firmly set the concentration-type solar energy base body at a required place.

To sum up, the present invention is a solar energy base-body structure, where a first frame and a second frame are formed with rod bodies coordinated with connection units; supporting units are used to fix the first frame and the second frame; and thus, the working process is simplified for fast assembling and cost and weight are reduced.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A light-collecting base-body structure, comprising:
   (A) a first frame, said first frame comprising
      a plurality of first rod bodies, each said first rod body having
      a hollow portion;
      a gap portion extending along a length of said rod body; and
      a plurality of long troughs extending along a length of said rod body and
      a plurality of connection units;
   (B) a second frame, said second frame comprising
      a plurality of second rod bodies, each said second rod body having
      a hollow portion; and
      a plurality of long-troughs and
      a plurality of connection units;
   (C) a plurality of supporting units, said supporting unit comprising two side plates, wherein each said gap portion extending along a length of said rod body is located at a side edge of said its respective rod body;
   wherein said plurality of long troughs extending along a length of said rod body of said first rod body is disposed on an outer side surface of said first rod body;
   wherein a plurality of said long troughs extending along a length of said rod body of said second rod body is disposed on an outer side surface of said second rod body and at least one long trough is disposed abutting the outer side surface of said second rod body;
   wherein said connection unit is configured to be located entirely within two said hollow portions of two adjacent said first rod bodies and in two said hollow portions of two adjacent said second rod bodies;
   wherein said side plates are connected with each other at a side, said side plate has two fixing members at each of two opposite ends of said side plate, and said side plate is fixed to a first said long trough of said first rod body and a first said side long trough of said second rod body coordinated with said fixing members;
   wherein said supporting unit is fixed at a place two adjacent said first rod bodies are connected; and
   wherein said supporting unit is fixed at a place two adjacent said second rod bodies are connected; and
   (D) at least one cap plate fixed between a second said long trough of said first rod bodies and a second said side long trough of corresponding said second rod bodies wherein said at least one cap plates is located at a side of said supporting unit.

2. The structure according to claim 1, wherein said gap portion is located at inner side edge of said first rod body; and
   wherein a lens is deposed across on said corresponding gap portions.

3. The structure according to claim 1, wherein a solar cell seat is fixed on a first said adjacent long trough of said second rod body.

4. The structure according to claim 1, wherein said connection unit comprises two insertion portions connected with each other at a side; and
   wherein two adjacent surfaces of two said insertion portions of said connection unit have a plurality of interference portions on each surface, said interference portions on each adjacent surface being formed as a series of parallel plates perpendicularly extending from each of said two adjacent surfaces.

5. The structure according to claim 1, wherein said connection unit has an 'L' shape.

6. The structure according to claim 1, wherein a supporting plate is fixed on at least one outside surface of said supporting unit.

7. A light-collecting base-body structure, comprising:
(A) a plurality of first rod bodies, each said first rod body having
   a hollow portion;
   a gap portion extending along a length of said rod body; and
   a plurality of long troughs extending along a length of said rod body;
(B) a plurality of second rod bodies, each said second rod body having
   a hollow portion; and
   a plurality of long troughs extending along a length of said rod body;
C) a plurality of connection units, said connection unit comprising two insertion portions;
D) a plurality of supporting units, said supporting unit comprising two side plates,
   wherein said gap portion extending along a length of said rod body is located at a side edge of said first rod body;
wherein said plurality of long troughs extending along a length of said first rod body is disposed on an outer side surface of said first rod body;
wherein a plurality of long troughs extending along a length of said rod body is disposed on an outer side surface of said second rod body and at least one of said long troughs is disposed abutting the outer side surface of said second rod body;
wherein said hollow portion of said first rod body and said hollow portion of said second rod body are penetrated through middle of said first rod body and said second rod body respectively;
wherein said two insertion portions of said connection unit of said first rod body are inserted into said hollow portions of two adjacent said first rod bodies separately, the entire connection unit being configured to be located within said hollow portions of said two adjacent first rod bodies;
wherein said two insertion portions of said connection unit of said second rod body are inserted into said hollow portions of two adjacent said second rod bodies separately;
wherein said two side plates of said supporting unit are connected with each other at a side, said side plate has two fixing members at each of two opposite ends of said side plate, and said side plate is fixed to first said long troughs of said first rod body and first said long troughs of said second rod body coordinated with said fixing members;
wherein said supporting unit is fixed at a place two adjacent said first rod bodies are connected; and
wherein said supporting unit is fixed at a place two adjacent said second rod bodies are connected; and
(E) at least one cap plate fixed between a second said long trough of said first rod bodies and a second said side long trough of corresponding said second rod bodies.

8. The structure according to claim 7, wherein each of two adjacent surfaces of two said insertion portions of said connection unit has a plurality of interference portions, said interference portions on each adjacent surface being formed as a series of parallel plates perpendicularly extending from each of said two adjacent surfaces.

9. The structure according to claim 7, wherein said connection unit has an 'L' shape.

10. The structure according to claim 7, wherein at least an outside surface of said supporting unit is fixed with a supporting plate.

* * * * *